United States Patent [19]

Tomimatsu et al.

[11] Patent Number: 5,781,429
[45] Date of Patent: Jul. 14, 1998

[54] PULSE CHARGING APPARATUS USING ELECTRON TUBE FOR SWITCHING CONTROL

[75] Inventors: Kazutaka Tomimatsu; Yasutoshi Ueda, both of Hyogo-ken; Osamu Kawabata; Shunsuke Kamei, both of Tokyo, all of Japan

[73] Assignee: Mitsubishi Heavy Industries, Ltd., Tokyo, Japan

[21] Appl. No.: 870,519

[22] Filed: Jun. 6, 1997

[30] Foreign Application Priority Data

Jun. 11, 1996 [JP] Japan ................................. 8-149323
Jan. 7, 1997 [JP] Japan ................................. 9-000781

[51] Int. Cl.$^6$ ................................................. H02M 7/26
[52] U.S. Cl. ................................. 363/112; 323/903
[58] Field of Search .......................... 323/903; 363/35, 363/41, 111, 112; 320/166

[56]  References Cited

U.S. PATENT DOCUMENTS 2,578,043  12/1951  Christy .................. 363/111 X
4,052,177  10/1977  Kide ..................... 363/131 X
4,682,369   7/1987  Schrader ................. 363/46 X

*Primary Examiner*—Peter S. Wong
*Assistant Examiner*—Y. J. Han
*Attorney, Agent, or Firm*—John P. White; Cooper & Dunham LLP

[57]  ABSTRACT

A pulse charging apparatus includes a DC high-voltage generator, a capacitor that is charged by a DC high voltage output from the DC high-voltage generator, a switching unit for switching charges stored on the capacitor to provide a pulse-like high voltage to a load, and a control unit for controlling the operation of the switching unit. The switching unit consists of a series combination of an electron tube and a stationary gap. The control unit controls the operation of the electron tube.

7 Claims, 3 Drawing Sheets

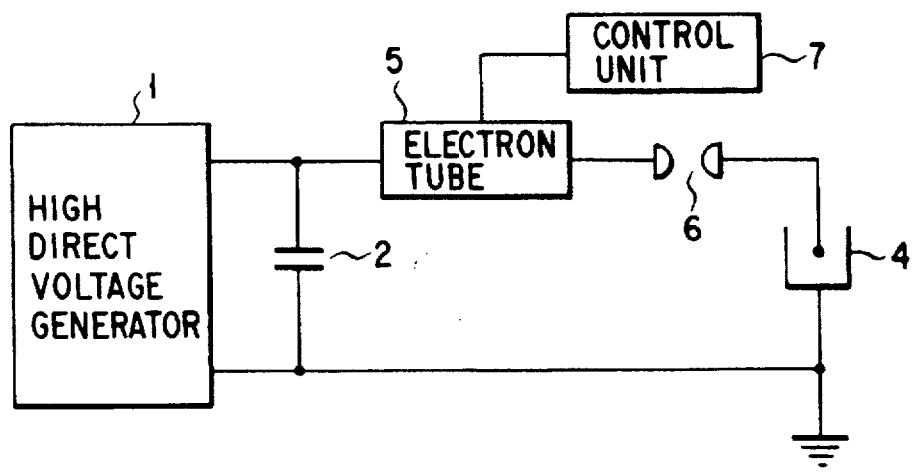
F I G. 4
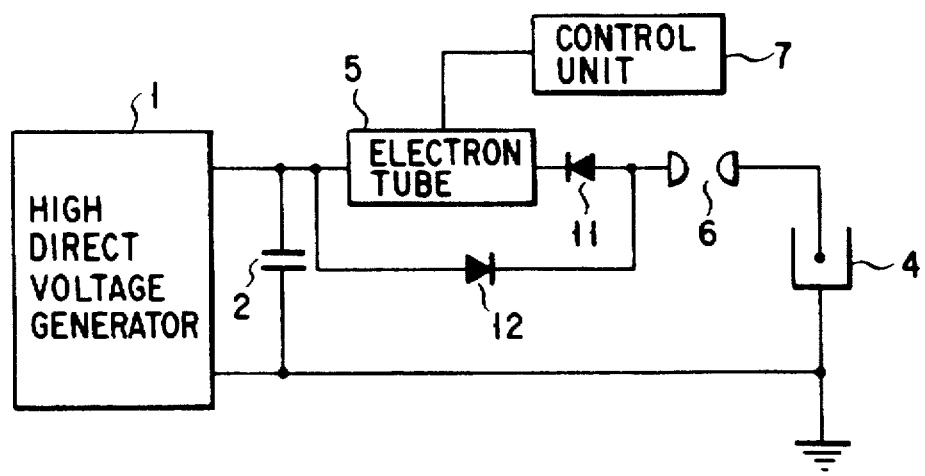
F I G. 5

5,781,429

PULSE CHARGING APPARATUS USING ELECTRON TUBE FOR SWITCHING CONTROL

BACKGROUND OF THE INVENTION

The present invention relates to a single power supply type pulse charging apparatus which is adapted for electrical equipment powered by a high voltage in the form of pulses, such as an electric dust precipitator, and more specifically to a pulse charging apparatus that uses an electronic tube for switching control.

An example of a conventional device that provides a high supply voltage in the form of pulses to an electric dust precipitator is a single power supply type pulse charging apparatus that, as shown in FIG. 1, provides a pulse voltage and a base voltage using a single power supply. In this device, an output voltage of a direct-current high voltage generator 1 is stored on a charging capacitor 2 and then applied to an electric precipitator 4 through a rotary spark gap 3 serving as a switching device.

It is to be noted that the conventional single power supply type pulse charging apparatus uses the rotary spark gap 3 as a switching device.

With the rotary spark gap used as the switching device, however, it will be required to lower its rotational speed when the performance becomes higher as the pulse frequency becomes lower as in the case where dust or particles of very high resistivity are removed. In this case, there is a drawback that good controllability is lost. That is, even after the switching device is turned off, the potential on the load side lowers due to corona resistance, producing a potential difference across the gap again. As a result, the switching device will be turned on again, failing to maintain a predetermined pulse frequency.

FIG. 2 shows voltage waveforms when switching is performed normally, and FIG. 3 shows voltage waveforms when the pulse frequency is reduced. Waveforms a in FIG. 3 indicate that, as described above, unwanted switching is performed after the switching device is turned off in the case where the switching period is set long to lower the pulse frequency.

Besides mechanical switching devices such as rotary spark gaps, there are electronic switching devices such as thyristors. None of the electronic switching devices can withstand a high voltage by itself. For this reason, a plurality of devices will be connected in series when used.

However, the use of a series combination of electronic switching devices needs means of operating each device uniformly, which makes the apparatus complex in structure and costly.

Electron tubes, such as thyratrons, can withstand high voltages and are low in cost. A high-voltage switching device consisting of an electron tube, such as a thyratron, can be turned on by a control signal, but cannot be forced to turn off. For this reason, the use of an electron tube such as a thyratron would not make it possible to apply a pulse-like voltage to the electric dust precipitator. If an electron tube such as a thyratron were used, a voltage that rises abruptly would merely be applied to the precipitator.

As a switching device for directly switching a high voltage, the electron tube such as the thyratron is low in cost and high in reliability and can be adapted to high repetition rates. However, the electron tube such as the thyratron cannot be turned off forcibly. When the electron tube such as the thyratron is used as it is with apparatus which, like an electric dust precipitator, needs a pulse-like high voltage, its conduction cannot be cut off easily. Consequently, the occurrence of resonance between the capacitor and the precipitator will continue.

Thus, the use of an electron tube such as the thyratron as the switching device of a pulse power supply for an electric dust precipitator will require means for turning the switching device off forcibly and in a short period of time.

Further, the thyratron itself has a problem that its lifetime is reduced by current flow in the reverse direction through it.

An object of the present invention is to provide a single power supply type pulse charging apparatus which provides reliable switching control of an electron tube, such as a thyratron, used as a switching device and good controllability with a simple arrangement, and increases the lifetime of the electron tube.

BRIEF SUMMARY OF THE INVENTION

According to a first aspect of the present invention there is provided a pulse charging apparatus for providing pulse charges based on a DC high voltage to a load comprising: a DC high-voltage generator; a capacitor that is charged by a DC high voltage output from the DC high-voltage generator; switching means having a series combination of a first electron tube and a stationary gap for switching charges stored on the capacitor to provide a pulse-like high voltage to the load; and control means for controlling the operation of the electron tube.

According to a second aspect of the present invention there is provided a pulse charging apparatus for providing pulse charges based on a DC high voltage to a load comprising: a DC high-voltage generator; a capacitor that is charged by a DC high voltage output from the DC high-voltage generator; switching means having a series combination of a first electron tube and a stationary gap for switching charges stored on the capacitor to provide a pulse-like high voltage to the load; a first magnetic assist circuit connected in series with the first electron tube and functioning as a time delay element only for current flow in the reverse direction through the first electron tube; a first bias circuit for saturating the first magnetic assist circuit so that it will function as the delay element; a second electron tube connected in parallel with the series combination of the first electron tube and the first magnetic assist circuit, the first and second electron tubes being arranged so that they are opposite in polarity with respect to each other; a second magnetic assist circuit connected in series with the second electron tube and functioning as a time delay element only for current flow in the reverse direction through the second electron tube; a second bias circuit for saturating the second magnetic assist circuit so that it will function as the delay element; and a control unit for controlling the first and second electron tubes.

In the present invention, by inserting a stationary gap between a switching device having an electron tube such as a thyratron and a load such as an electric dust precipitator, the decay of LC resonance occurring between the capacitor and the load is speeded up by the gap resistance and the conduction between the capacitor and the load is cut off automatically when the potential difference across the gap is lowered to less than its dielectric breakdown voltage. Thus, even if an electron tube is used for the switching device, the circuit can be turned off automatically, allowing a pulse-like high voltage to be applied to the electric dust precipitator.

In addition, in the electron tube, only current flow in the forward direction is permitted and current flow in the reverse direction is blocked, thereby increasing the lifetime of the electron tube.

Thus, a single power supply type pulse charging apparatus can be provided which is high in reliability, low in cost, and good in controllability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 shows an arrangement of a single power supply type pulse charging apparatus according to a first embodiment of the present invention;

FIG. 5 shows an arrangement of a single power supply type pulse charging apparatus according to a second embodiment of the present invention.

DETAILED DESCRIPTION OF THE INVENTION

Figure 1:
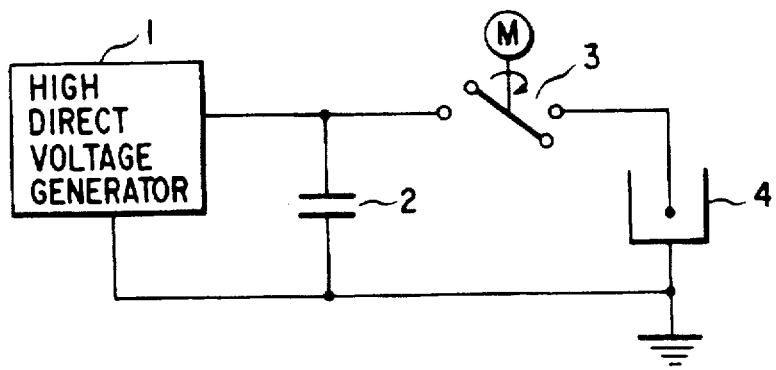
FIG. 1 shows an arrangement of a conventional single power supply type pulse charging apparatus.
Figure 2:
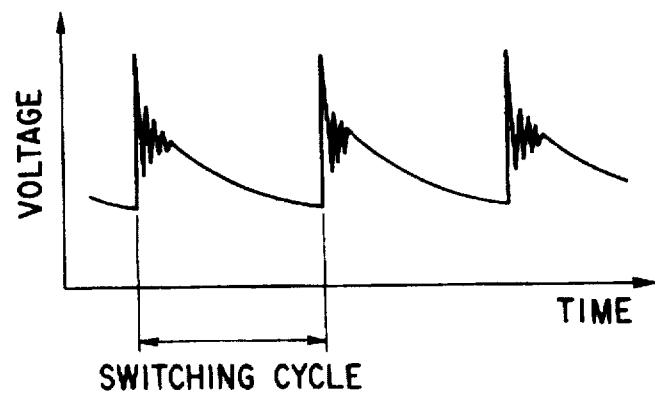
FIG. 2 shows normal voltage waveforms in the single power supply system pulse charging apparatus.
Figure 3:
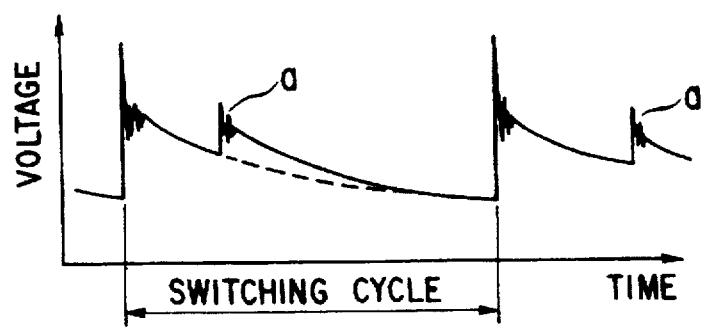
FIG. 3 shows abnormal voltage waveforms in the single power supply system pulse charging apparatus which occur when the switching period is set longer.

Referring now to FIG. 4 there is illustrated a single power supply type pulse charging apparatus according to a first embodiment of the present invention.

In this apparatus, an output voltage of a DC high-voltage generator 1 is stored on a charging capacitor 2 and then applied to a load, for example, an electric dust precipitator 4, via a switching device. The switching device includes an electron tube 5 such as a thyratron and a stationary gap 6. The ON operation of the electron tube 5 is controlled by a control unit 7.

In this arrangement, a DC high voltage output from the DC high-voltage generator 1 is stored on the capacitor 2. At this point, the electron tube 5 is turned ON by a control signal from the control unit 7. As a result, charges stored on the capacitor 2 are going to flow into the precipitator 4 via the electron tube 5.

This applies a high potential to the stationary gap 6, so that the gap is short-circuited to enter the ON state. LC resonance is thus induced by the capacitor 2, the precipitator 4, and circuit components between them. As a result, a high-frequency pulse-like high voltage accompanied by oscillation is applied to the precipitator 4.

The stationary gap 6 functions as a resistor, which helps decay the LC resonance quickly. As a result of decay of the LC resonance, the capacitor 2 and the precipitator 4 reach the same level of potential. When the potential difference between the capacitor 2 and the precipitator 4 becomes zero or below the dielectric breakdown voltage, the insulation of the gap is restored, automatically placing its associated circuit portion in the OFF state.

As a result, the electron tube 5 is also turned OFF and placed in the wait state for the next control signal.

By only the control operation of turning the electron tube ON (i.e., without the operation of turning the tube OFF), a pulse-like high voltage can certainly be applied to the precipitator 4.

The control unit 7 can set the switching cycle and the quiescent time of the precipitator 4, which depend on its charged state, in cooperation with the control unit (not shown) of the DC high-voltage generator 1 as required.

Next, a second embodiment of the present invention will be described with reference to FIG. 5.

In the second embodiment, a diode 11 is connected between the electron tube 5 and the stationary gap 6 in the forward direction with respect to the current flow from the capacitor 2 to the precipitator 4 (the present embodiment assumes that the precipitator 4 is charged negatively), and a bypass circuit consisting of a diode 12 is connected in parallel with the series combination of the diode 11 and the electron tube 5. In this case, the diodes 11 and 12 are disposed so that they are opposite to each other in polarity.

The second embodiment is intended to prevent oscillating currents which, of oscillating currents resulting from circuit resonance, flow in the reverse direction from flowing through the electron tube 5, thereby ensuring that the lifetime of the electron tube is increased. In this case, depending on the characteristics of components, such as diodes, etc., inductive components can be incorporated as required.

Figure 6:
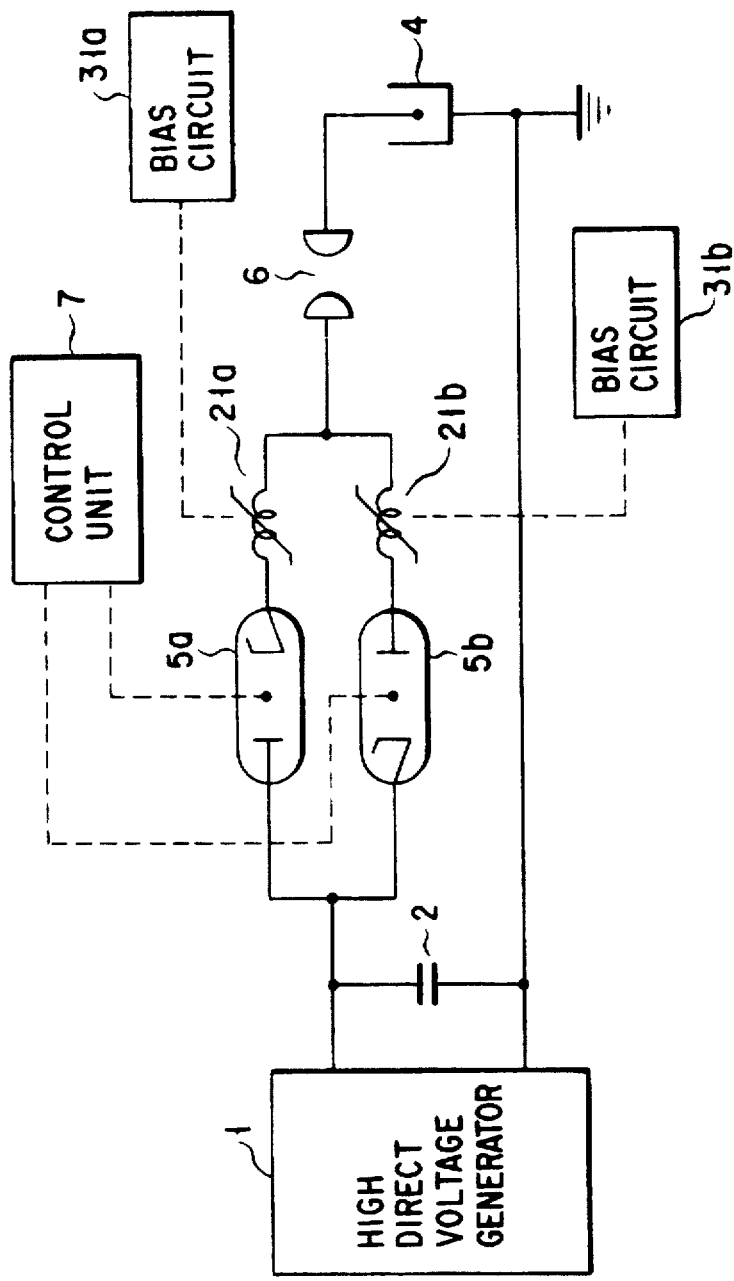
FIG. 6 shows an arrangement of a single power supply type pulse charging apparatus according to a third embodiment of the present invention.

A third embodiment of the present invention will be described next with reference to FIG. 6.

In the third embodiment, an electron tube 5a, such as a thyratron, is connected between the capacitor 2 and the stationary gap 6 in the forward direction with respect to current flow from the capacitor to the precipitator and a magnetic assist circuit 21a is connected between the electron tube 5a and the gap 6. Further, a series combination of an electron tube 5b and a magnetic assist circuit 21b is connected in parallel with the series combination of the electron tube 5a and the magnetic assist circuit 21a with the electron tubes 5a and 5b disposed in the opposite polarity to each other. Each of the magnetic assist circuits 21a and 21b is biased by a respective one of bias circuits 31a and 31b so that it will always be saturated in one direction. The ON control of the electron tubes 5a and 5b is performed by the control unit 7.

Each of the magnetic assist circuits 21a and 21b functions to block current flow through the corresponding electron tube for a give period of time when current is going to flow through it in the reverse direction. That is, when current is going to flow in the reverse direction through one of the electron tubes, for example, the tube 5a, current flow through the tube 5a is blocked for the given period of time by the corresponding magnetic assist circuit 21a. On the other hand, during that given period of time current is allowed to flow through the other tube 5b in the forward direction. For high-frequency current flow, the current blocking time is allowed to be short, allowing the magnetic assist circuits 21a and 21b to be made compact.

If, when a pulse-like voltage is output, the magnetic assist circuits are not saturated in the desired direction, the current flow in the forward direction is blocked, so that the pulse width increases. To avoid this, the bias circuits 31a and 31b are provided to allow the magnetic circuits to be always saturated in the desired direction. Thus, an increase in the pulse width can be prevented.

The control unit 7 adapted to control the operation of the electron tubes 5a and 5b may be provided for each of the tubes. By combining individual control units into a single one as shown in FIG. 6, the control unit can be made compact and the control operation can be performed in an efficient manner.

Although the present invention was described in terms of embodiments applied to an electric dust precipitator, the invention is also applicable to a power supply for a pulse laser.

For each of the electron tubes, use may be made of a multi-tube configuration in which multiple tubes are connected in series or in parallel.

As described above, according to the present invention, a single power supply type pulse charging apparatus is provided which uses an inexpensive electron tube, such as a thyratron, as its switching device and allows a control unit to turn ON the switching device with a control signal at desired times. Further, the gap resistance functions to speed up the decay of LC resonance that occurs between a charging capacitor and a load such as an electric dust precipitator and the switching device is automatically turned OFF when the potential difference across the gap becomes zero or below the dielectric breakdown voltage, allowing a pulse-like voltage to be provided to the precipitator. As a result, pulse charging can be achieved by the use of an economical single power supply which is simple in construction and good in controllability.

In addition, by using a combination of diodes to block current flow in the reverse direction in an electron tube, the lifetime and reliability of the electron tube can be improved.

Moreover, by parallel connecting two series combinations each of an electron tube and a magnetic assist circuit in such a way that the electron tube in one series combination is opposite in polarity to the electron tube in the other series combination, current flow in the reverse direction through each electron tube can be prevented and hence the lifetime and reliability of the electron tubes can be improved.

Furthermore, by the provision of bias circuits for the magnetic assist circuits, the prevention of current flow in the reverse direction through the electron tubes can be ensured, improving the reliability and outputting a stable pulse-like output voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A pulse charging apparatus for providing pulse charges based on a DC high voltage to a load comprising:

a DC high-voltage generator;

a capacitor that is charged by a DC high voltage output from the DC high-voltage generator;

switching means having a series combination of a first electron tube and a stationary gap for switching charges stored on the capacitor to provide a pulse-like high voltage to the load; and control means for controlling the operation of the electron tube.

2. The pulse charging apparatus according to claim 1, further comprising a first diode connected in series with the electron tube so as to allow current flow from the electron tube to the load, and a second diode connected in parallel with the series combination of the electron tube and the first diode so that current in the reverse direction will flow through the series combination of the electron tube and the first diode.

3. The pulse charging apparatus according to claim 1, further comprising a first magnetic assist circuit connected in series with the first electron tube for serving as a time delay element only for current flow in the reverse direction through the first electron tube, a second electron tube associated with the capacitor in the opposite polarity to the first electron tube, and second magnetic assist circuit connected in series with the second electron tube and serving as a time delay element only for current flow in the reverse direction through the second electron tube, and wherein a circuit formed of the second electron tube and the second magnetic assist circuit is connected in parallel with a circuit formed of the first electron tube and the first magnetic assist circuit with the first and second electron tubes arranged such that they are opposite in polarity with respect to each other, the control means controls the operation of the second electron tube.

4. The pulse charging apparatus according to claim 1, further comprising bias circuits for saturating the first and second magnetic assist circuits so that they function as delay elements.

5. The pulse charging apparatus according to claim 1, wherein said first electron tube comprises a plurality of tubes connected to each others in parallel and/or series.

6. The pulse charging apparatus according to claim 3, wherein said second electron tube comprises a plurality of tubes connected to each others in parallel and/or series.

7. A pulse charging apparatus for providing pulse charges based on a DC high voltage to a load comprising:

a DC high-voltage generator;

a capacitor that is charged by a DC high voltage output from the DC high-voltage generator;

switching means having a series combination of a first electron tube and a stationary gap for switching charges stored on the capacitor to provide a pulse-like high voltage to the load;

a first magnetic assist circuit connected in series with the first electron tube and functioning as a time delay element only for current flow in the reverse direction through the first electron tube;

a first bias circuit for saturating the first magnetic assist circuit so that it will function as the delay element;

a second electron tube connected in parallel with the series combination of the first electron tube and the first magnetic assist circuit, the first and second electron tubes being arranged so that they are opposite in polarity with respect to each other;

a second magnetic assist circuit connected in series with the second electron tube and functioning as a time delay element only for current flow in the reverse direction through the second electron tube;

a second bias circuit for saturating the second magnetic assist circuit so that it will function as the delay element; and a control unit for controlling the first and second electron tubes.

* * * * *